(12) United States Patent
Min et al.

(10) Patent No.: US 11,445,598 B2
(45) Date of Patent: Sep. 13, 2022

(54) PRINTED CIRCUIT BOARD AND ANTENNA MODULE COMPRISING THE SAME

(71) Applicant: SAMSUNG ELECTRO-MECHANICS CO., LTD., Suwon-si (KR)

(72) Inventors: Tae Hong Min, Suwon-si (KR); Ju Ho Kim, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 117 days.

(21) Appl. No.: 17/068,290

(22) Filed: Oct. 12, 2020

(65) Prior Publication Data
US 2021/0329777 A1 Oct. 21, 2021

(30) Foreign Application Priority Data
Apr. 16, 2020 (KR) .................. 10-2020-0045842

(51) Int. Cl.
| | |
|---|---|
| *H01Q 1/00* | (2006.01) |
| *H05K 1/02* | (2006.01) |
| *H01Q 1/12* | (2006.01) |
| *H01Q 21/06* | (2006.01) |
| *H05K 1/11* | (2006.01) |
| *H05K 1/03* | (2006.01) |

(52) U.S. Cl.
CPC ............. *H05K 1/0243* (2013.01); *H01Q 1/12* (2013.01); *H01Q 21/065* (2013.01); *H05K 1/0277* (2013.01); *H05K 1/0353* (2013.01); *H05K 1/115* (2013.01); *H05K 2201/0141* (2013.01); *H05K 2201/10098* (2013.01)

(58) Field of Classification Search
CPC .. H05K 1/0243; H05K 1/0277; H05K 1/0353; H05K 1/115; H05K 2201/0141; H05K 2201/10098; H01Q 1/12; H01Q 21/065
See application file for complete search history.

(56) References Cited

U.S. PATENT DOCUMENTS

| | | | |
|---|---|---|---|
| 9,860,978 B1* | 1/2018 | Liu | H05K 1/0277 |
| 2007/0040626 A1* | 2/2007 | Blair | H05K 1/147 |
| | | | 333/1 |
| 2013/0082984 A1* | 4/2013 | Drzaic | G09G 3/20 |
| | | | 345/204 |

(Continued)

FOREIGN PATENT DOCUMENTS

| | | |
|---|---|---|
| JP | 6168258 B1 | 7/2017 |
| KR | 10-1301064 B1 | 8/2013 |
| KR | 10-2016-0080871 A | 7/2016 |

*Primary Examiner* — Binh B Tran
(74) *Attorney, Agent, or Firm* — Morgan, Lewis & Bockius LLP

(57) ABSTRACT

A printed circuit board has a first stacked body having a flexible region and a rigid region, and a second stacked body disposed on the rigid region of the first stacked body. The first stacked body includes a plurality of first insulating layers, a plurality of first bonding layers, and a plurality of first wiring layers. The second stacked body includes a plurality of second insulating layers and a plurality of second wiring layers, and each of the plurality of first bonding layers integrally covers at least a portion of upper and side surfaces of a respective first wiring layer of the plurality of first wiring layers.

18 Claims, 6 Drawing Sheets

(56) References Cited

U.S. PATENT DOCUMENTS

2015/0195921 A1* 7/2015 Onodera ............ C09K 19/3087
                                                    174/258
2017/0279177 A1* 9/2017 Oguri ........................ H01Q 1/50
2017/0332479 A1* 11/2017 Luo-Larson ........... H05K 1/028

* cited by examiner

PRINTED CIRCUIT BOARD AND ANTENNA MODULE COMPRISING THE SAME

CROSS-REFERENCE TO RELATED APPLICATION(S)

This application claims benefit of priority to Korean Patent Application No. 10-2020-0045842 filed on Apr. 16, 2020 in the Korean Intellectual Property Office, the disclosure of which is incorporated herein by reference in its entirety.

BACKGROUND

1. Field

The present disclosure relates to a printed circuit board and an antenna module comprising the same.

2. Description of Related Art

Recently, with the introduction of 5G mobile communications technology, the frequency bandwidth used for communication has increased, while each country (region) has used a variety of frequency bands. Accordingly, a product capable of increasing the bandwidth and responding to multiple frequency bands is required, and the number of antennas required for the product is also increasing. In addition, technology for reducing signal transmission loss in the high frequency region is under development.

SUMMARY

An aspect of the present disclosure is to provide a printed circuit board capable of miniaturization and thinning of a product.

An aspect of the present disclosure is to provide a printed circuit board capable of reducing signal transmission loss.

An aspect of the present disclosure is to provide a printed circuit board including an antenna.

An aspect of the present disclosure is to provide an antenna module capable of miniaturization and thinning of a product.

An aspect of the present disclosure is to provide an antenna module capable of reducing signal transmission loss.

An aspect of the present disclosure is to provide an antenna module including a plurality of antennas.

An aspect of the present disclosure is to provide an antenna module capable of responding to frequencies of multiple bands.

According to an aspect of the present disclosure, a printed circuit board includes a first stacked body having a flexible region and a rigid region, and a second stacked body disposed on the rigid region of the first stacked body. The first stacked body includes a plurality of first insulating layers, a plurality of first bonding layers, and a plurality of first wiring layers, and the second stacked body includes a plurality of second insulating layers and a plurality of second wiring layers. Each of the plurality of first bonding layers integrally covers at least a portion of upper and side surfaces of a respective first wiring layer of the plurality of first wiring layers.

According to another aspect of the present disclosure, an antenna module includes a printed circuit board including a first stacked body having a flexible region and a rigid region, and a second stacked body disposed on the rigid region of the first stacked body. An antenna is disposed on a side of the first stacked body, opposite to a side on which the second stacked body is disposed.

According to another aspect of the present disclosure, a printed circuit board includes a first stacked body including a flexible region and a rigid region, the first stacked body including a plurality of insulating layers that are stacked together with wiring layers therebetween and that extend across both the flexible and rigid regions. A second stacked body is stacked on the rigid region of the first stacked body, the second stacked body including a plurality of insulating layers that are stacked together with wiring layers therebetween and that extend across only the rigid region from among the rigid and flexible regions. Each of the insulating layers that extends across the flexible and rigid regions has a composition different from each of the insulating layers that extends across only the rigid region from among the flexible and rigid regions.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
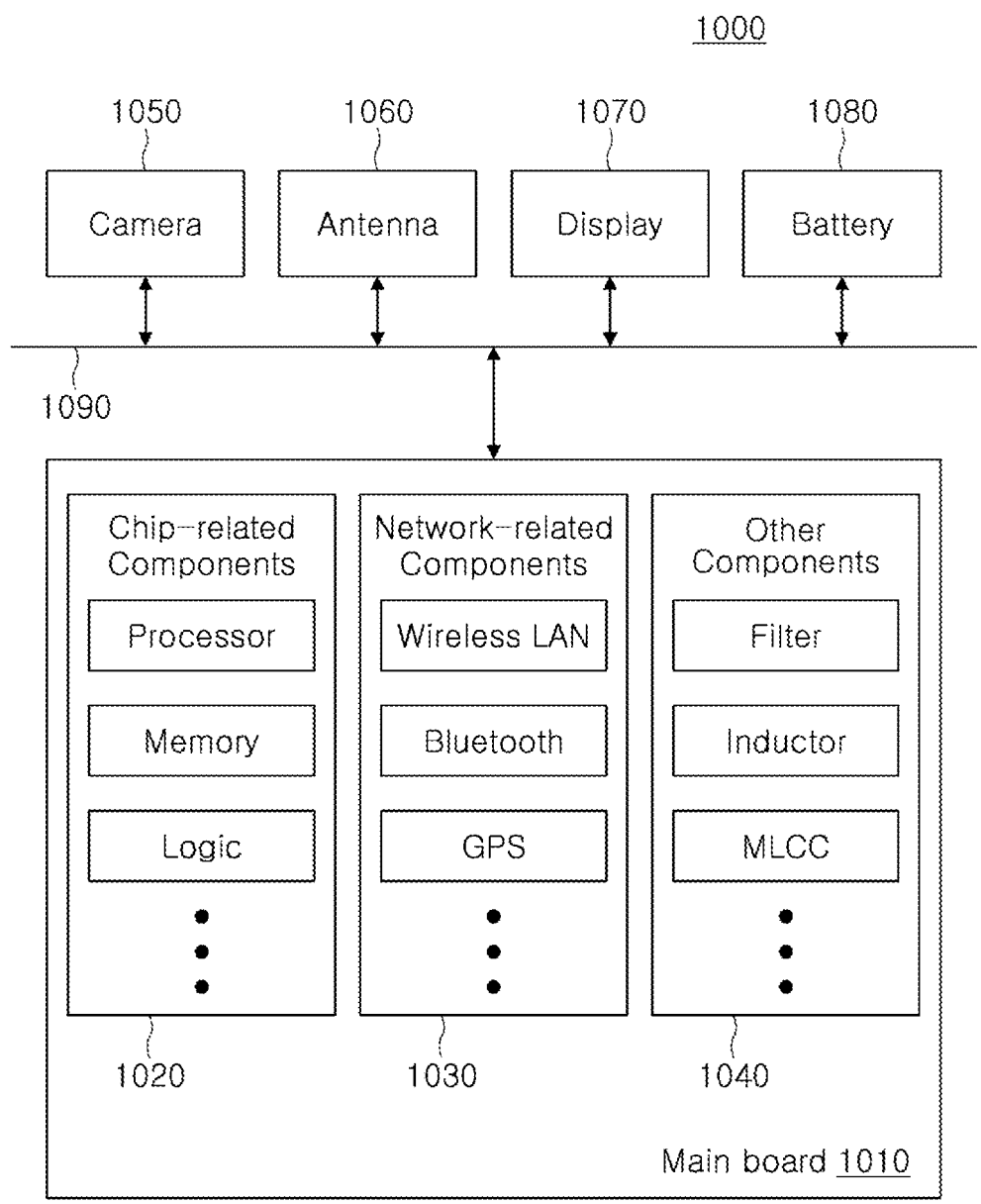
FIG. 1 is a block diagram schematically illustrating an example of an electronic device system.

Hereinafter, the present disclosure will be described with reference to the accompanying drawings. Shape and size of the elements in the drawings may be exaggerated or reduced for more clear description.

Electronics

FIG. 1 is a block diagram schematically illustrating an example of an electronic device system.

Referring to the drawings, an electronic device 1000 may accommodate a main board 1010 therein. The main board 1010 may include chip related components 1020, network related components 1030, other components 1040, and the like, physically and/or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip related components 1020 are not limited thereto, but may also include other types of chip related components. In addition, the chip related components 1020 may be combined with each other. The chip related component 1020 may be in the form of a package including the above-described chip or an electronic component.

The network related components 1030 may include components compatible with or communicating using various protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components compatible with or communicating using a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 and/or the network related components 1030 described above.

Depending on a type of the electronic device 1000, the electronic device 1000 may include other components that may or may not be physically and/or electrically connected to the main board 1010. These other components may include, for example, a camera module 1050, an antenna module 1060, a display device 1070, a battery 1080, or the like. However, these other components are not limited thereto, but may also include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
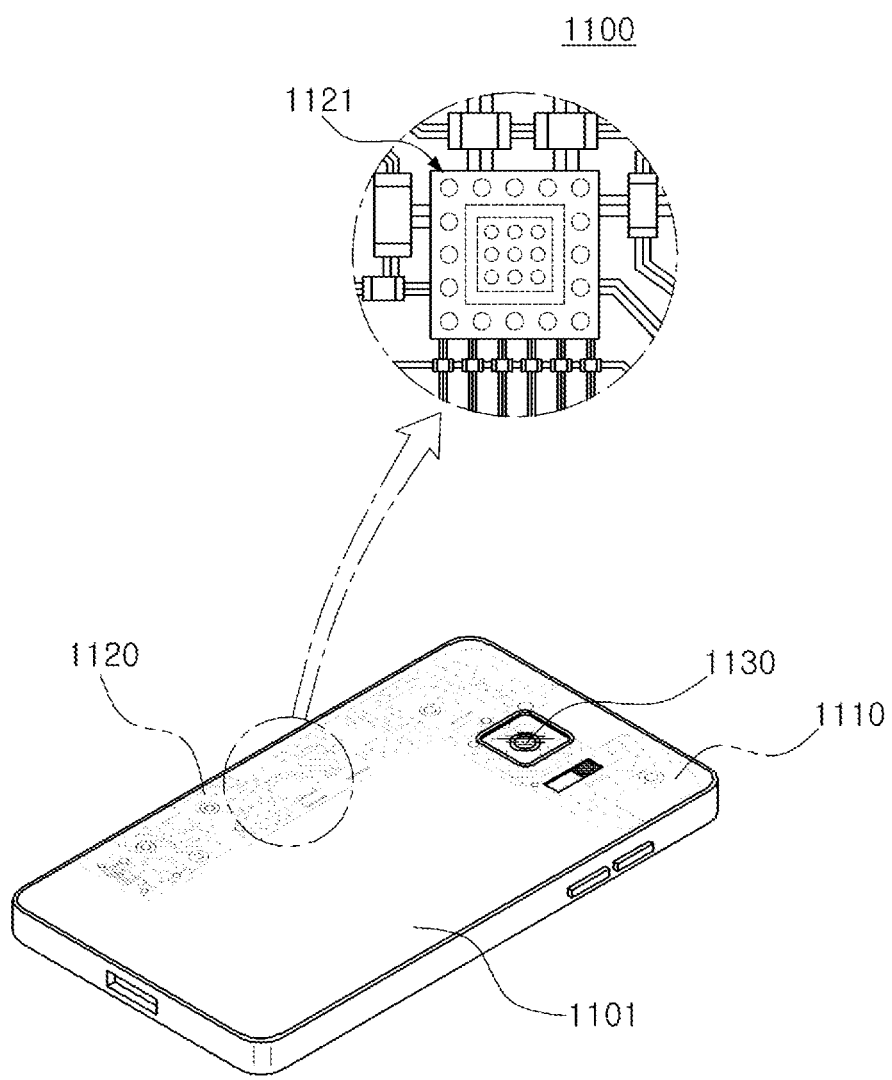
FIG. 2 is a perspective view schematically illustrating an example of an electronic device.

FIG. 2 is a perspective view schematically illustrating an example of an electronic device.

Referring to the drawings, an electronic device may be, for example, a smartphone 1100. A main board 1110 may be accommodated in the smartphone 1100, and various electronic components 1120 may be physically and/or electrically connected to the main board 1110. In addition, other electronic components, such as a camera module 1130 and/or a speaker 1140, which may or may not be physically and/or electrically connected to the main board 1110 may be accommodated therein. A portion of the electronic components 1120 may be the above-described chip related components, for example, an antenna module 1121, but are not limited thereto. The antenna module 1121 may be provided as a surface-mounted form in which a semiconductor chip or a passive component is mounted on a printed circuit board, but is not limited thereto. The electronic device is not necessarily limited to the smartphone 1100, but may be other electronic devices as described above.

Printed Circuit Board and Antenna Module

Figure 3:
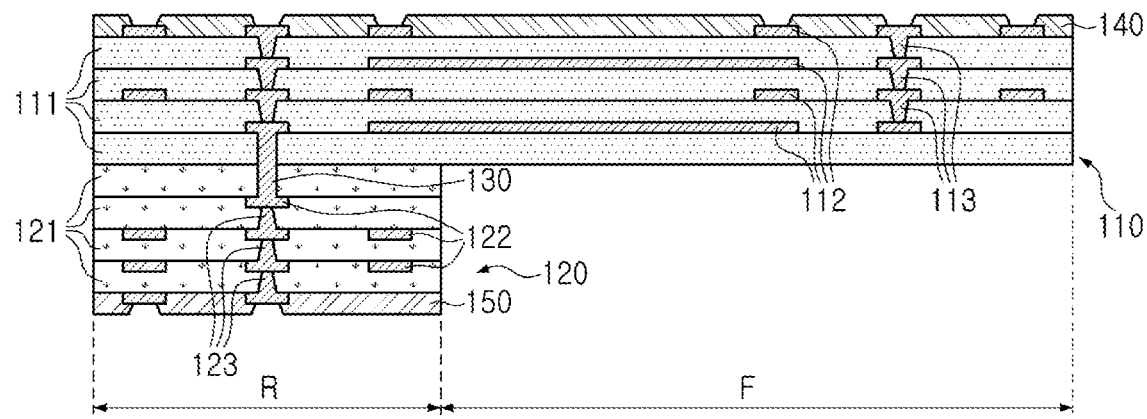
FIG. 3 is a cross-sectional view schematically illustrating an example of a printed circuit board according to the present disclosure.

FIG. 3 is a cross-sectional view schematically illustrating an example of a printed circuit board according to the present disclosure.

Referring to the drawings, a printed circuit board 100A according to an example may have a flexible region F and a rigid region R, and may include a first stacked body 110 and a second stacked body 120.

The flexible region F of the printed circuit board 100A may include the first stacked body 110, and the rigid region R of the printed circuit board 100A may include the first stacked body 110 and the second stacked body 120 disposed on the first stacked body 110. As illustrated, the second stacked body 120 may be placed only on one surface of the first stacked body 110. In addition, the second stacked body 120 may be only disposed on a portion of the first stacked body 110. In addition, the printed circuit board 100A may have a region including only the first stacked body 110 as the flexible region F, and may have a region including the first stacked body 110 and the second stacked body 120 as the rigid region R.

The first stacked body 110 may include a plurality of first insulating layers 111, a plurality of first wiring layers 112, and a plurality of first via layers 113. Each of the plurality of first wiring layers 112 may be disposed on a respective first insulating layer of the plurality of first insulating layers 111. Each of the plurality of first via layers 113 may penetrate a respective first insulating layer of the plurality of first insulating layers 111 and may electrically connect first wiring layers of the plurality of first wiring layers 112 disposed in different layers.

The second stacked body 120 may include a plurality of second insulating layers 121, a plurality of second wiring layers 122, and a plurality of second via layers 123. Each of the plurality of second wiring layers 122 may be disposed on a respective second insulating layer of the plurality of second insulating layers 121. Each of the plurality of second via layers 123 may penetrate a respective second insulating layer of the plurality of second insulating layers 121 and may electrically connect second wiring layers of the plurality of second wiring layers 122 disposed on different layers.

A printed circuit board 100A according to an example may further include a through-via 130 penetrating at least a portion of each of the first stacked body 110 and the second stacked body 120, and connecting at least a portion of the plurality of first wiring layers 112 and at least a portion of the plurality of second wiring layers 122 to each other. For example, the through-via 130 may penetrate a lowermost first insulating layer 111 among the plurality of first insulating layers 111 and an uppermost second insulating layer 121 among the plurality of second insulating layers 121, and may connect a lowermost first wiring layer 112 among the plurality of first wiring layers 112 and an uppermost second wiring layer 122 among the plurality of second wiring layers 122 to each other.

A printed circuit board 100A according to an example may further include a first passivation layer 140 and/or a second passivation layer 150, disposed on each of the first stacked body 110 and the second stacked body 120.

Signal transmission loss in the first stacked body 110 may be less than signal transmission loss in the second stacked body 120. The signal transmission loss in each of the first stacked body 110 and the second stacked body 120 may be adjusted by adjusting a dielectric constant (Dk) and/or a dielectric dissipation factor (Df) of each of the plurality of first insulating layers 111 and the plurality of second insulating layers 121.

As described later, electronic components such as an antenna or the like may be mounted on the first stacked body 110 of the printed circuit board 100A, and the first stacked body 110 may be implemented to reduce signal transmission loss in the first stacked body 110 on which the antenna or the like is mounted, to minimize high-frequency signal transmission loss. In addition, since various materials may be used in consideration of price, mounting properties, and the like as a material of forming the second stacked body 120, decrease in production costs and/or convenience in process may be achieved.

The first stacked body 110 may include a patch antenna. For example, at least one of the plurality of first wiring layers 112 may include or provide an antenna signal pattern, and thus may be implemented as the patch antenna. Alternatively, in order to improve signal transmission power, at least one of the plurality of first wiring layers 112 may be implemented with a combination of the patch antenna and a dipole antenna, or may be implemented with only the dipole antenna.

As described above, when the first stacked body 110 includes the patch antenna, a printed circuit board that may be miniaturized and thinned while including the antenna may be provided. Alternatively, when a plurality of antennas are provided, a portion of the antennas may be included in the first stacked body 110 of the printed circuit board 100A, to reduce the number of antennas surface-mounted on the printed circuit board 100A.

Hereinafter, components of a printed circuit board 100A according to an example will be described in more detail.

The flexible region F may refer to a region that may be more easily bent or folded, compared to the rigid region R. The rigid region R may refer to a region that may be formed by extending one side of the first stacked body 110 disposed in the flexible region F in one direction. In this case, as illustrated in the drawings, only one side of the first stacked body 110 disposed in the flexible region F may extend in the one direction, and the other side, which is a side opposing the one side, may not extend.

Each of the plurality of first insulating layers 111 and the plurality of second insulating layers 121 may have different characteristics. To this end, each of the plurality of first insulating layers 111 and the plurality of second insulating layers 121 may include different materials. Alternatively, in some cases, each of the plurality of first insulating layers 111 may include the same material as each of the second insulating layers 121. In other cases, all of the plurality of first insulating layers 111 may include a same material composition as each other, all of the second insulating layers 121 may include a same material composition as each other, and the material compositions of the first and second insulating layers 111 and 121 may be the same as or different from each other.

An elastic modulus of each of the plurality of first insulating layers 111 may be lower than an elastic modulus of each of the plurality of second insulating layers 121. Therefore, the first insulating layer 111 may have relatively easy bending or folding characteristics, compared to the second insulating layer 121, and the printed circuit board 100A may have a flexible region F capable of being bent and/or folded.

As a material for forming the first insulating layer 111, in terms of having properties that may be easy to bend or fold, polyimide (PI), polyethylene terephthalate (PET), polyethylene naphthalate (PEN), polycarbonate (PC), polyethersulfone (PES), polyacrylate (PAR), liquid crystal polymer (LCP), or the like may be used. In addition, as the material for forming the first insulating layer 111, a reinforcing material such as a glass fiber, a filler, and/or the like may not be included.

Signal transmission loss in the first stacked body 110 may be less than signal transmission loss in the second stacked body 120. The signal transmission loss in each of the first stacked body 110 and the second stacked body 120 may be adjusted by adjusting a dielectric constant (Dk) and/or a dielectric dissipation factor (Df) of each of the plurality of first insulating layers 111 and the plurality of second insulating layers 121.

In addition, the signal transmission loss in the plurality of first insulating layers 111 may be less than the signal transmission loss in the plurality of second insulating layers 121. Also, signal transmission loss in each of the plurality of first insulating layers 111 may be less than signal transmission loss in each of the plurality of second insulating layers 121.

For example, a dielectric constant (Dk) of each of the plurality of first insulating layers 111 may be higher than a dielectric constant (Dk) of each of the plurality of second insulating layers 121. The present disclosure is not limited thereto, and the dielectric constant (Dk) of each of the plurality of first insulating layers 111 may be the same as the dielectric constant (Dk) of each of the plurality of second insulating layers 121, or may be lower than the dielectric constant (Dk) of each of the plurality of second insulating layers 121.

Alternatively or additionally, a dielectric dissipation factor (Df) of each of the plurality of first insulating layers 111 may be less than a dielectric dissipation factor (Df) of each of the plurality of second insulating layers 121. The present disclosure is not limited thereto, and the dielectric dissipation factor (Df) of each of the plurality of first insulating layers 111 may be the same as the dielectric dissipation factor (Df) of each of the plurality of second insulating layers 121, or may be greater than the dielectric dissipation factor (Df) of each of the plurality of second insulating layers 121.

As a material for forming each of the plurality of first insulating layers 111, at least one of a ceramic or a ceramic-polymer composite may be used in view of low signal transmission loss. The ceramic-polymer composite may have a composition in which a ceramic filler is dispersed in an organic binder. A polymer such as polytetrafluoroethylene (PTFE), epoxy, or the like may be used as the organic binder. A filler composed of $SiO_2$, $TiO_2$, $Al_2O_3$, or the like may be used as the ceramic filler. The ceramic-polymer composite may include a glass fiber as a reinforcing material, optionally.

Alternatively, as a material for forming each of the plurality of first insulating layers 111, a liquid crystal polymer (LCP), polytetrafluoroethylene (PTFE), polyphenylene sulfide (PPS), polyphenylene ether (PPE), polyimide (PI), cyclo olefin polymer (COP), polyether ether ketone (PEK), or the like may be used.

The signal transmission loss in the first insulating layer 111 may be adjusted according to a type of material for forming the first insulating layer 111, a type of a binder, a type of a filler, a content of the binder, or a content of the filler, contained in the first insulating layer 111, or the like.

The number of first insulating layers 111 in the first stacked body 110 is not particularly limited, and materials, thicknesses, or the like of the plurality of first insulating layers 111 may be the same as or different from each other. The first insulating layers 111 may be provided as a first insulating layer 111.

Each of the plurality of first wiring layers 112 may perform various functions according to a design of the respective layers. For example, each of the plurality of first wiring layers 112 may include a ground pattern, a power pattern, a signal pattern, or the like. In this case, the signal pattern may include patterns for carrying various signals, except for the ground pattern, the power pattern, and the like, for example, an antenna signal, a data signal, or the like. Each of these patterns may include a line pattern, a plane pattern, and/or a pad pattern.

As described above, at least one of the plurality of first wiring layers 112 may include an antenna signal pattern, and thus may implement a patch antenna. Alternatively, in order to improve signal transmission power, at least one of the plurality of first wiring layers 112 may implement a combination of the patch antenna and a dipole antenna, or may implement only the dipole antenna.

A conductive material may be used as a material for forming each of the plurality of first wiring layers 112, and, as a non-limiting example thereof, copper (Cu), aluminum (Al), silver (Ag), tin (Sn), gold (Au), nickel (Ni), lead (Pb), titanium (Ti), or alloys thereof, or the like may be used. Each of the plurality of first wiring layers 112 may be formed by a plating process.

Different first via layers 113 of the plurality of first via layers 113 may perform different functions according to a design of the respective layers. For example, the plurality of first via layers 113 may include a via for signal connection, a via for ground connection, a via for power connection, or the like.

A conductive material may be used as a material for forming each of the plurality of first via layers 113, and, as a non-limiting example thereof, copper (Cu), aluminum (Al), silver (Ag), tin (Sn), gold (Au), nickel (Ni), lead (Pb), titanium (Ti), or alloys thereof, or the like may be used. Vias of the plurality of first via layers 113 may include vias in which a metal material is completely filled in a hole of the via, or in which a metal material is formed only along a wall surface of a hole of the via.

The vias among the plurality of first via layers 113 may have shapes such as a tapered shape, an hourglass shape, a cylindrical shape, or the like. When a via included among the plurality of first via layers 113 has a tapered shape, the via may have a shape tapered in an opposite direction to a tapered shape of a via included in each of the plurality of second via layers 123.

An insulating material may be used as a material for forming each of the plurality of second insulating layers 121. A material including a thermosetting resin such as an epoxy resin, a thermoplastic resin such as polyimide, or a reinforcing material such as a glass fiber, a glass cloth, or a glass fabric and/or an inorganic filler, together with these, for example, a prepreg, Ajinomoto build-up film (ABF), photo-imageable dielectric (PID), or the like may be used, but are not limited thereto.

The number of second insulating layers 121 in the second stacked body 120 may not be particularly limited, and materials, thicknesses, or the like of the plurality of second insulating layers 121 may be the same as or different from each other. The second insulating layers 121 may be provided as a second insulating layer 121.

Different second wiring layers 122 among the plurality of second wiring layers 122 may perform different functions according to a design of the respective layers. For example, the plurality of second wiring layers 122 may include a ground pattern, a power pattern, a signal pattern, or the like. In this case, the signal pattern may carry various signals, except for signals carried by ground pattern(s), power pattern(s), and the like, such as for example, an antenna signal, a data signal, or the like. Each of these patterns may include a line pattern, a plane pattern, and/or a pad pattern.

As a material for forming each of the plurality of second wiring layers 122, copper (Cu), aluminum (Al), silver (Ag), tin (Sn), gold (Au), nickel (Ni), lead (Pb), titanium (Ti), or alloys thereof, or the like may be used. Each of the plurality of second wiring layers 122 may be formed by a plating process.

Different second via layers 123 of the plurality of second via layers 123 may perform different functions according to a design of the respective layers. For example, the plurality of second via layers 123 may include a via for signal connection, a via for ground connection, a via for power connection, or the like.

A conductive material may be used as a material for forming each of the plurality of second via layers 123, and, as a non-limiting example thereof, copper (Cu), aluminum (Al), silver (Ag), tin (Sn), gold (Au), nickel (Ni), lead (Pb), titanium (Ti), or alloys thereof, or the like may be used. Vias of the plurality of second via layers 123 may include vias in which a metal material is completely filled in a hole of the via, or in which a metal material is formed only along a wall surface of a hole of the via.

The vias among the plurality of second via layers 123 may have shapes such as a tapered shape, an hourglass shape, a cylindrical shape, or the like. When a via included among the plurality of second via layers 123 has a tapered shape, the via may have a shape tapered in an opposite direction to a tapered shape of a via included in each of the plurality of first via layers 113.

The through-via 130 may penetrate at least a portion of each of the first stacked body 110 and the second stacked body 120, and may connect at least a portion of the plurality of first wiring layers 112 and at least a portion of the plurality of second wiring layers 122 to each other. For example, the through-via 130 may penetrate a lowermost first insulating layer 111 among the plurality of first insulating layers 111 and an uppermost second insulating layer 121 among the plurality of second insulating layers 121, and may connect a lowermost first wiring layer 112 among the plurality of first wiring layers 112 and an uppermost second wiring layer 122 among the plurality of second wiring layers 122 to each other.

A conductive material may be used as a material for forming the through-via 130, and, as a non-limiting example thereof, copper (Cu), aluminum (Al), silver (Ag), tin (Sn), gold (Au), nickel (Ni), lead (Pb), titanium (Ti), or alloys thereof, or the like may be used. The through-via 130 may be a via in which a metal material is completely filled in a hole of the via, or in which a metal material is formed only along a wall surface of a hole of the via. When the through-via 130 is formed as one in which a metal material is formed only along the wall surface of the hole of the via, an insulating material may fill in the hole of the via. Further, the through-via 130 may have a shape such as a tapered shape, an hourglass shape, a cylindrical shape, or the like.

The first passivation layer 140 may be disposed on the first stacked body 110 to serve as a protective layer protecting the first stacked body 110. The first passivation layer 140 may have an opening exposing at least a portion of the first wiring layer 112. The first passivation layer 140 may be an Ajinomoto build-up film (ABF) layer, or may be a solder resist (SR) layer. The present disclosure is not limited thereto, and other insulating material(s) may be used as a material for forming the first passivation layer 140.

The second passivation layer 150 may be disposed on the second stacked body 120 to serve as a protective layer protecting the second stacked body 120. The second passivation layer 150 may have an opening exposing at least a portion of the second wiring layer 122. The second passivation layer 150 may be an Ajinomoto build-up film (ABF) layer, or may be a solder resist (SR) layer. The present disclosure is not limited thereto, and other insulating material(s) may be used as a material for forming the second passivation layer 150.

Figure 4:
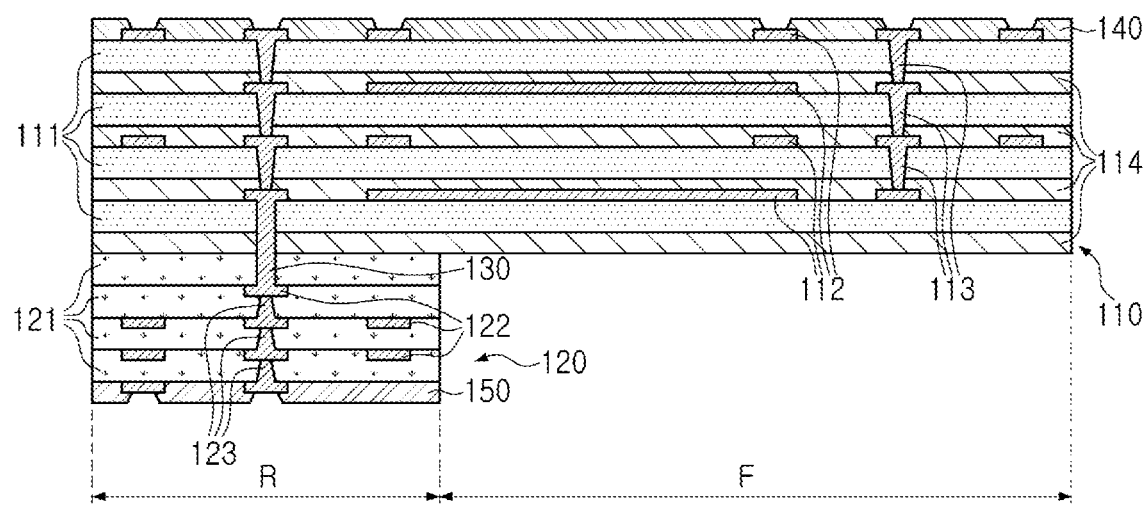
FIG. 4 is a cross-sectional view schematically illustrating another example of a printed circuit board according to the present disclosure.

FIG. 4 is a cross-sectional view schematically illustrating another example of a printed circuit board according to the present disclosure.

Referring to the drawings, in a printed circuit board 100B according to an example, a first stacked body 110 may further include a plurality of first bonding layers 114.

The first bonding layers 114 may each be disposed on a respective first insulating layer of the plurality of first insulating layers 111, to cover a respective first wiring layer 112 of the plurality of first wiring layers 112. For example, as illustrated in the drawings, each of the plurality of first bonding layers 114 may be disposed on a respective first insulating layer 111 of the plurality of first insulating layers 111, to integrally cover at least a portion of each of upper and side surfaces of a respective first wiring layer 112 of the plurality of first wiring layers 112.

In addition, a lowermost first bonding layer 114 among the plurality of first bonding layers 114 may be disposed between a lowermost first insulating layer 111 among the plurality of first insulating layers 111 and an uppermost second insulating layer 121 among the plurality of second insulating layers 121.

Signal transmission loss in the plurality of first bonding layers 114 may be less than signal transmission loss in the plurality of second insulating layers 121. Signal transmission loss in each of the plurality of first bonding layers 114 may be less than signal transmission loss in each of the plurality of second insulating layers 121. The signal transmission loss in the plurality of first bonding layers 114 may be adjusted by adjusting a dielectric constant (Dk) and/or a dielectric dissipation factor (Df) of the plurality of first bonding layers 114.

For example, a dielectric constant (Dk) of each of the plurality of first bonding layers 114 may be higher than a dielectric constant (Dk) of each of the plurality of second insulating layers 121. The present disclosure is not limited thereto, and the dielectric constant (Dk) of each of the plurality of first bonding layers 114 may be the same as the dielectric constant (Dk) of each of the plurality of second insulating layers 121, or may be lower than the dielectric constant (Dk) of each of the plurality of second insulating layers 121.

Alternatively, a dielectric dissipation factor (Df) of each of the plurality of first bonding layers 114 may be less than a dielectric dissipation factor (Df) of each of the plurality of second insulating layers 121. The present disclosure is not limited thereto, and the dielectric dissipation factor (Df) of each of the plurality of first bonding layers 114 may be the same as the dielectric dissipation factor (Df) of each of the plurality of second insulating layers 121, or may be greater than the dielectric dissipation factor (Df) of each of the plurality of second insulating layers 121.

Each of the plurality of first bonding layers 114 may be a bonding sheet. Alternatively, as a material for forming each of the plurality of first bonding layers 114, polytetrafluoroethylene (PTFE), epoxy, polyphenylene ether (PPE), polyimide (PI), modified polyimide (PI), or the like may be used.

A thickness of each of the plurality of first insulating layers 111 may be equal to or greater than a thickness of each of the plurality of first bonding layers 114. For example, a thickness of each of the plurality of first insulating layers 111 may be greater than a thickness of each of the plurality of first bonding layers 114, or may be substantially the same as a thickness of each of the plurality of first bonding layers 114. In some cases, a thickness of each of the plurality of first insulating layers 111 may be less than a thickness of each of the plurality of first bonding layers 114.

Figure 5:
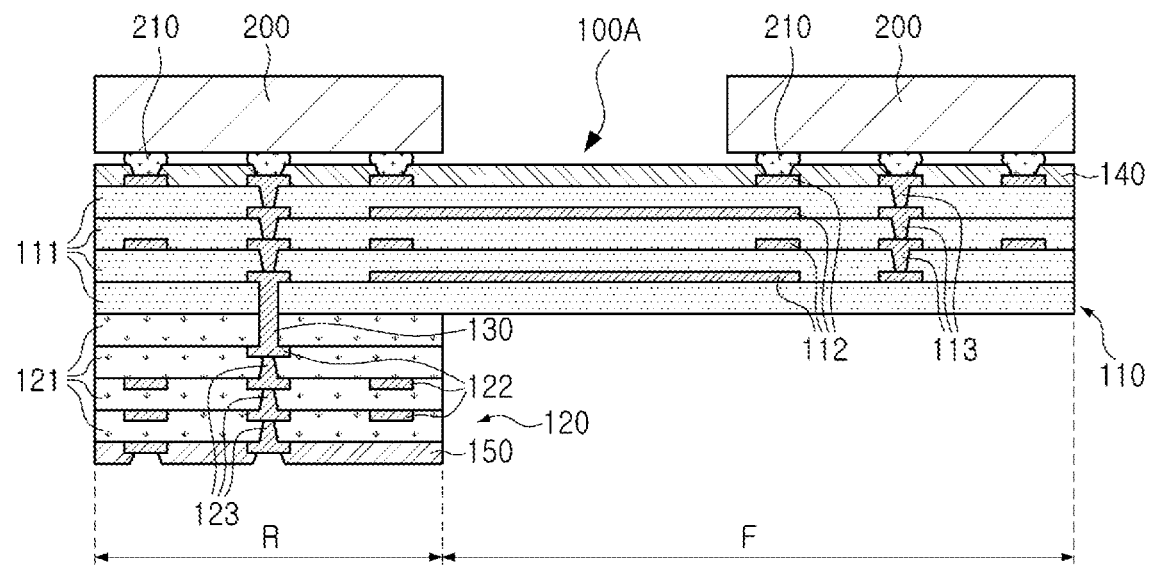
FIG. 5 is a cross-sectional view schematically illustrating an example of an antenna module according to the present disclosure.

FIG. 5 is a cross-sectional view schematically illustrating an example of an antenna module according to the present disclosure.

Referring to the drawings, an antenna module according to an example may include a printed circuit board 100A and an antenna 200 disposed on the printed circuit board 100A.

The antenna 200 may be disposed on a side of a first stacked body 110, opposite to a side on which a second stacked body 120 is disposed. Referring to the drawings, the antenna 200 may be disposed on an upper side of the first stacked body 110, and the second stacked body 120 may be disposed on a lower side of the first stacked body 110.

The antenna 200 may be a chip antenna, but may not be limited thereto. For example, the antenna 200 may be a dipole antenna, a patch antenna, or the like.

Optionally, other electronic components, instead of the antenna 200, may be mounted on the printed circuit board 100A. Alternatively, other electronic components, together with the antenna 200, may be mounted on the printed circuit board 100A. For example, at least one of an active component, a passive component, or an electronic component package may be mounted on the printed circuit board 100A.

The antenna 200 may be provided as a plurality of antennas 200. In this case, a portion of the plurality of antennas 200 may be disposed in a flexible region F of the printed circuit board 100A, and the other portion of the plurality of antennas 200 may be disposed in a rigid region R of the printed circuit board 100A.

The antenna 200 may be mounted on the printed circuit board 100A by a conductive connection structure 210. Also, the antenna 200 may be electrically connected to a first wiring layer 112 and/or a second wiring layer 122 of the printed circuit board 100A by the conductive connection structure 210. The conductive connection structure 210 may be a solder ball, but is not limited thereto.

As described above, signal transmission loss in the first stacked body 110 may be less than signal transmission loss in the second stacked body 120. The signal transmission loss in each of the first stacked body 110 and the second stacked body 120 may be adjusted by adjusting a dielectric constant (Dk) and/or a dielectric dissipation factor (Df) of a plurality of first insulating layers 111 and a plurality of second insulating layers 121. For some examples, signal transmission loss per unit length of signal path in the first stacked body 110 may be less than signal transmission loss per unit length of signal path in the second stacked body 120.

The antenna 200 may be mounted on the first stacked body 110 of the printed circuit board 100A, and the first stacked body 110 may be implemented to reduce signal transmission loss in the first stacked body 110 on which the antenna 200 is mounted, to minimize high-frequency signal transmission loss. In addition, since various materials may be used in consideration of price, mounting properties, and the like as a material of forming the second stacked body 120, decrease in production costs and/or convenience in process may be achieved.

As described above, the first stacked body 110 may include a patch antenna. For example, at least one of the plurality of first wiring layers 112 may include an antenna signal pattern, and thus may implement the patch antenna. Alternatively, in order to improve signal transmission power, at least one of the plurality of first wiring layers 112 may implement a combination of the patch antenna and a dipole antenna, or may implement only the dipole antenna.

As described above, when the first stacked body 110 includes the patch antenna, a printed circuit board 100A that may be miniaturized and thinned while including the antenna may be provided. Alternatively, when a plurality of antennas are provided, a portion of the antennas may be included in the first stacked body 110 of the printed circuit board 100A, to reduce the number of antennas 200 surface-mounted on the printed circuit board 100A.

In a case of an antenna module according to an example, a portion of the antennas 200 may be mounted on the printed circuit board 100A, and other portions of the antennas may be included on or in the printed circuit board 100A in a form of a patch antenna. Therefore, an antenna module capable of responding to frequencies in multiple different frequency bands may be provided.

Since other aspects may be substantially the same as those described above in the description of FIG. 3, detailed descriptions thereof will be omitted.

Figure 6:
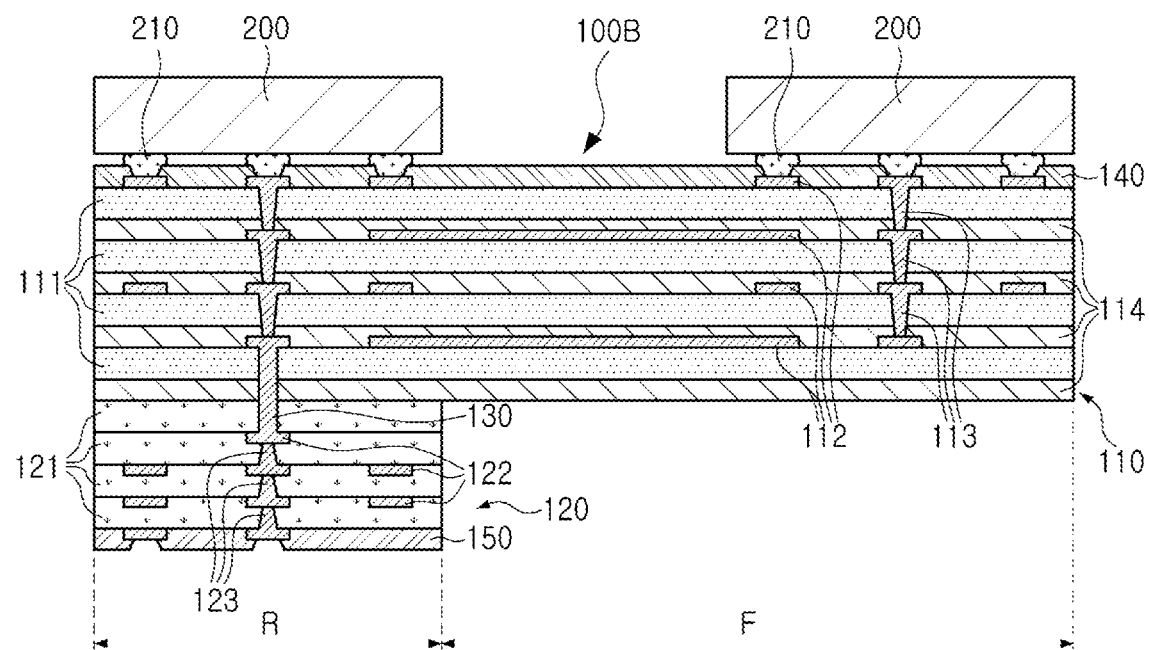
FIG. 6 is a cross-sectional view schematically illustrating another example of an antenna module according to the present disclosure.

FIG. 6 is a cross-sectional view schematically illustrating another example of an antenna module according to the present disclosure.

Referring to the drawings, an antenna module according to an example may include a printed circuit board 100B and an antenna 200 disposed on the printed circuit board 100B. A structure of the printed circuit board 100B included in the antenna module according to FIG. 6 may be different from the structure of the printed circuit board 100A included in the antenna module according to FIG. 5.

Since other aspects may be substantially the same as those described above in the description of FIGS. 3 to 5, detailed descriptions thereof will be omitted.

Figure 7:
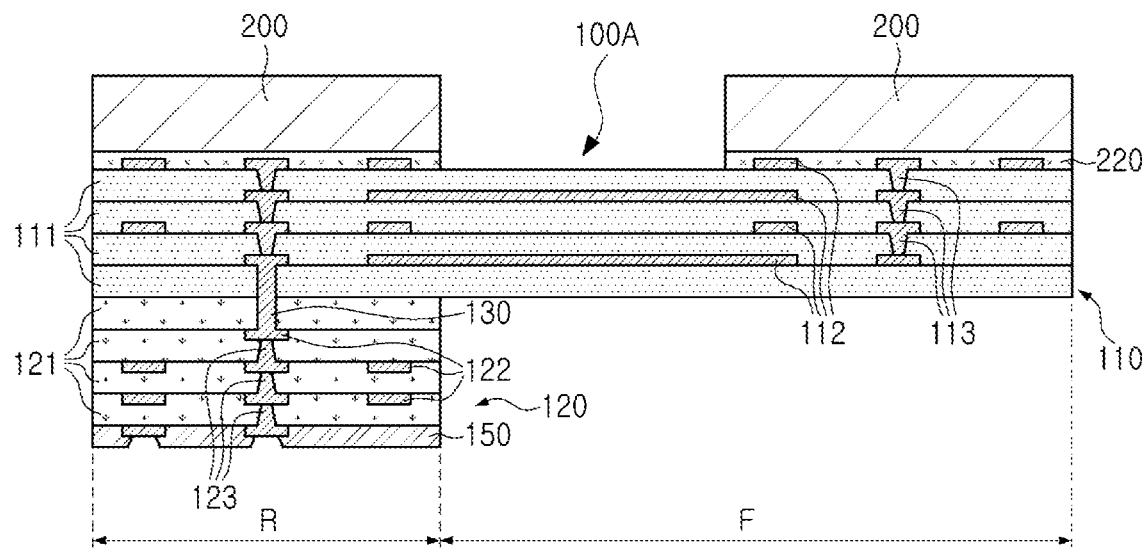
FIG. 7 is a cross-sectional view schematically illustrating another example of an antenna module according to the present disclosure.

FIG. 7 is a cross-sectional view schematically illustrating another example of an antenna module according to the present disclosure.

Referring to the drawings, in an antenna module according to an example, an antenna 200 may be disposed on a printed circuit board 100A by a conductive bonding layer 220, compared to the antenna module according to FIG. 5.

The antenna 200 may be electrically connected to a first wiring layer 112 and/or a second wiring layer 122 of the printed circuit board 100A by the conductive bonding layer 220. The conductive bonding layer 220 may be an anisotropic conductive film (ACF), but is not limited thereto.

The conductive bonding layer 220 may be disposed only on a partial region of a first stacked body 110, as illustrated in the drawings, or the conductive bonding layer 220 may be disposed on the entire region of the first stacked body 110, in a different manner to those as illustrated in the drawings. In addition, the printed circuit board 100A may not include a first passivation layer, as illustrated in the drawings, but optionally, the printed circuit board 100A may include a first passivation layer, in a different manner to those as illustrated in the drawings.

As one effect of disposing the antenna 200 by the conductive bonding layer 220 as described above, when the first wiring layer 112 has a fine pitch, the first wiring layer 112 and the antenna 200 may be easily connected. In addition, as another effect, different from the one effect, an effect of reducing signal transmission loss between the antenna 200 and the first wiring layer 112 may be provided.

Since other aspects may be substantially the same as those described above in the description of FIGS. 3 to 6, detailed descriptions thereof will be omitted.

Figure 8:
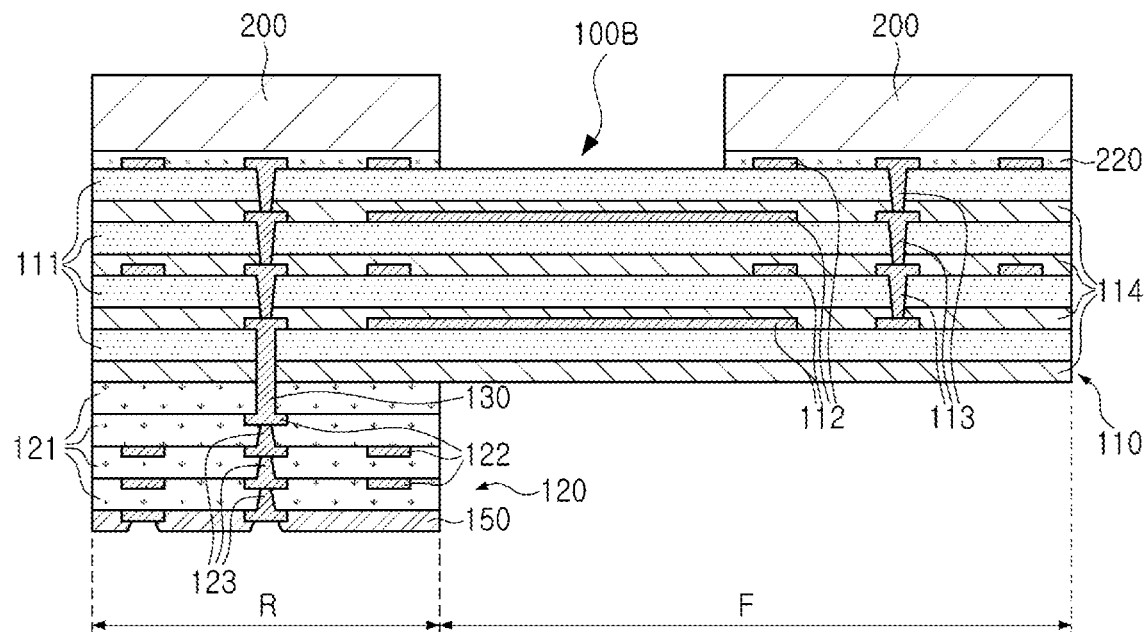
FIG. 8 is a cross-sectional view schematically illustrating another example of an antenna module according to the present disclosure.

FIG. 8 is a cross-sectional view schematically illustrating another example of an antenna module according to the present disclosure.

Referring to the drawings, an antenna module according to an example may include a printed circuit board 100B and an antenna 200 disposed on the printed circuit board 100B. A structure of the printed circuit board 100B included in the antenna module according to FIG. 8 may be different from the structure of the printed circuit board 100A included in the antenna module according to FIG. 7.

Since other aspects may be substantially the same as those described above in the description of FIGS. 3 to 7, detailed descriptions thereof will be omitted.

Figure 9:
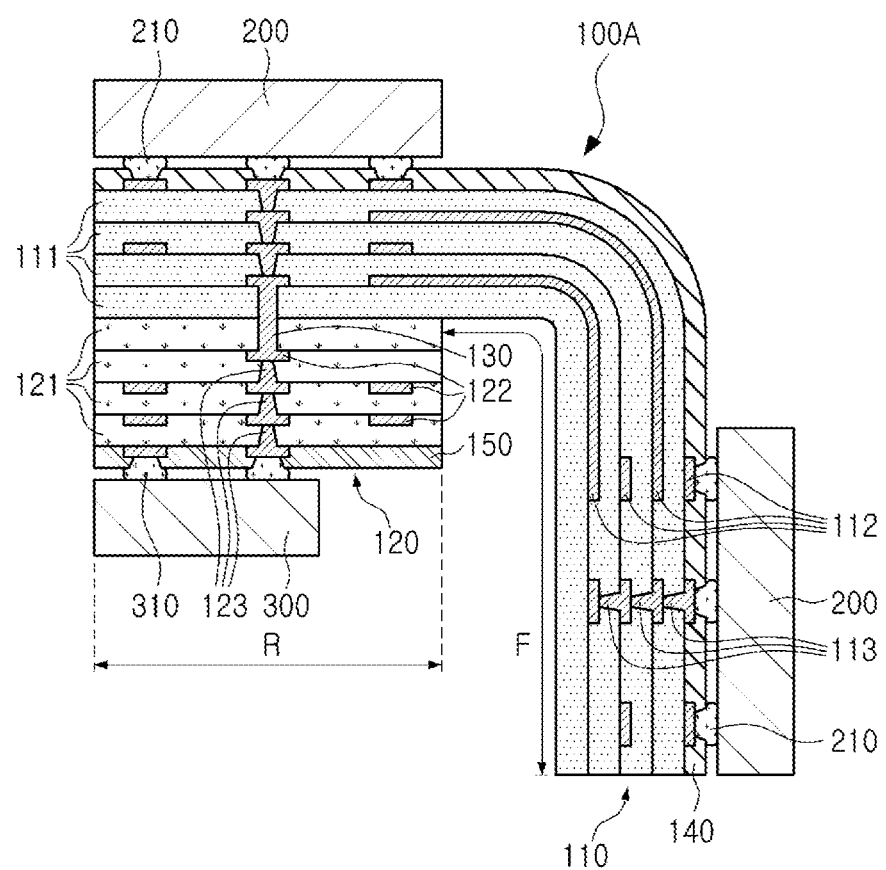
FIG. 9 is a cross-sectional view schematically illustrating an example after bending of an antenna module according to the present disclosure.

FIG. 9 is a cross-sectional view schematically illustrating an example after bending of an antenna module according to the present disclosure.

Referring to the drawings, a flexible region F of an antenna module may be bended to a side of the antenna module, opposing a side of the antenna module on which an antenna 200 is disposed.

In a case of a printed circuit board 100A according to an example, a second stacked body 120 may not be disposed in the flexible region F. Therefore, a thickness of the flexible region F may be less than a thickness of a rigid region R. In addition, a degree of freedom in layout design of the antenna module in an electronic device may be improved. In this case, the thickness refers to a thickness of each of the first stacked body 110 and the second stacked body 120 in a stacking direction. Referring to the drawings, the thickness refers to a distance between an upper side and a lower side of the printed circuit board 100A.

In a case of an antenna module according to an example, when the printed circuit board 100A is bent, the flexible region F having a relatively thin thickness may be bent, and a lower surface of the flexible region F before bending may face a side surface of the rigid region R. Therefore, when the antenna module is bent, a width of the antenna module may be further reduced. In this case, the width of the antenna module may be provided, perpendicular to the thickness of the antenna module, and may be provided, parallel to a thickness of the first stacked body 110 in the flexible region F after bending of the antenna module. Referring to the drawings, the width of the antenna module may be a distance between left and right sides of the antenna module. Depending on a design, the antenna module may be disposed on an electronic device while being bent, and may increase a degree of freedom in design of electronic components. In addition, a size of the electronic device may be reduced.

Referring to the drawings, the antenna module may further include an electronic component 300 disposed on the second stacked body 120. The electronic component 300 may be disposed in the rigid region R of the printed circuit board 100A.

The electronic component 300 may be a radio frequency integrated circuit (RFIC) chip, but is not limited thereto. For example, the electronic component 300 may be at least one of an active component, a passive component, or an electronic component package.

The electronic component 300 may be mounted on the printed circuit board 100A by a conductive connection structure 310. In addition, the electronic component 300 may be electrically connected to the first wiring layer 112 and/or the second wiring layer 122 of the printed circuit board 100A by the conductive connection structure 310. The conductive connection structure 310 may be a solder ball, but is not limited thereto.

Although the electronic component 300 is mounted on the antenna module disclosed in FIG. 5 as an example, the antenna module disclosed in other drawings may be applied without limitation.

In the present disclosure, the terms "flexible region F" and "rigid region R" may be used to describe relative characteristics between the respective regions, and may not be interpreted to limit regions in which the rigid region R is not bent or folded.

In the present disclosure, the terms "upper," "uppermost," "lower," "lowermost," "left," and "right" may be used based on the drawings. However, the terms are for convenience of description, and are not intended to limit a specific direction.

As used herein, the term "connect" or "connection" in the present specification may be not only a direct connection, but also a concept including an indirect connection. In addition, the term "electrically connected" or "electrical connection" in the present specification is a concept including both a physical connection and a physical non-connection.

In the present specification, the expressions of "first," second," etc. in the present specification are used to distinguish one component from another, and do not limit the order and/or importance of the components. In some cases, without departing from the spirit of the present disclosure, a "first" component may be referred to as a "second" component, and similarly, a "second" component may be referred to as a "first" component.

The expression "example" used in this specification does not refer to the same embodiment to each other, but may be provided for emphasizing and explaining different unique features. However, the above-mentioned examples do not exclude that the above-mentioned examples are implemented in combination with the features of other examples. For example, although the description in a specific example is not described in another example, it can be understood as an explanation related to another example, unless otherwise described or contradicted by the other example.

The terms used in the present disclosure are used only to illustrate various examples and are not intended to limit the present inventive concept. Singular expressions include plural expressions unless the context clearly dictates otherwise.

As an effect of the present disclosure, a printed circuit board capable of miniaturization and thinning of a product may be provided.

As an effect of the present disclosure, a printed circuit board capable of reducing signal transmission loss may be provided.

As an effect of the present disclosure, a printed circuit board including an antenna may be provided.

As an effect of the present disclosure, an antenna module capable of miniaturization and thinning of a product may be provided.

As an effect of the present disclosure, an antenna module capable of reducing signal transmission loss may be provided.

As an effect of the present disclosure, an antenna module including a plurality of antennas may be provided.

As an effect of the present disclosure, an antenna module capable of responding to frequencies of multiple bands may be provided.

While example embodiments have been illustrated and described above, it will be apparent to those skilled in the art that modifications and variations could be made without departing from the scope of the present disclosure as defined by the appended claims.

What is claimed is:

1. A printed circuit board comprising:
   a first stacked body having a flexible region and a rigid region; and
   a second stacked body disposed on one side of the rigid region of the first stacked body,
   wherein the first stacked body includes a plurality of first insulating layers, a plurality of first bonding layers, and a plurality of first wiring layers,
   the second stacked body includes a plurality of second insulating layers and a plurality of second wiring layers,
   each of the plurality of first bonding layers integrally covers at least a portion of upper and side surfaces of a respective first wiring layer of the plurality of first wiring layers, and
   an antenna is disposed directly on the first stacked body.

2. The printed circuit board according to claim 1, wherein the rigid region extends from only one side of the flexible region of the first stacked body.

3. The printed circuit board according to claim 1, wherein an elastic modulus of each of the plurality of first insulating layers is lower than an elastic modulus of each of the plurality of second insulating layers.

4. The printed circuit board according to claim 1, wherein a dielectric constant of each of the plurality of first insulating layers is higher than a dielectric constant of each of the plurality of second insulating layers.

5. The printed circuit board according to claim 1, wherein each of the plurality of first wiring layers is disposed on a respective first insulating layer of the plurality of first insulating layers, and
   each of the plurality of first bonding layers is disposed on a respective first insulating layer of the plurality of first insulating layers and covers a corresponding one of the plurality of first wiring layers.

6. The printed circuit board according to claim 1, wherein each of the plurality of first insulating layers comprises at least one of a ceramic or a ceramic-polymer composite.

7. The printed circuit board according to claim 1, wherein a thickness of each of the plurality of first insulating layers is equal to or greater than a thickness of each of the plurality of first bonding layers.

8. The printed circuit board according to claim 1, wherein a dielectric constant of each of the plurality of first bonding layers is higher than a dielectric constant of each of the plurality of second insulating layers.

9. The printed circuit board according to claim 1, wherein at least one of the plurality of first wiring layers comprises an antenna signal pattern coupled to the antenna.

10. The printed circuit board according to claim 1, wherein the first stacked body further comprises a plurality of first via layers penetrating the plurality of first insulating layers and connecting the plurality of first wiring layers to each other,
the second stacked body further comprises a plurality of second via layers penetrating the plurality of second insulating layers and connecting the plurality of second wiring layers to each other, and
each via layer of the plurality of first via layers and the plurality of second via layers has a tapered shape, and each via layer of the plurality of first via layers is orientated in an opposite direction to each via layer of the plurality of second via layers.

11. The printed circuit board according to claim 1, further comprising:
a through-via disposed in the rigid region, penetrating a lowermost first insulating layer among the plurality of first insulating layers and an uppermost second insulating layer among the plurality of second insulating layers, and connecting a lowermost first wiring layer among the plurality of first wiring layers and an uppermost second wiring layer among the plurality of second wiring layers to each other.

12. An antenna module comprising:
a printed circuit board including a first stacked body having a flexible region and a rigid region, and a second stacked body disposed on the rigid region of the first stacked body; and
an antenna disposed on a side of the first stacked body opposite to a side on which the second stacked body is disposed,
wherein the first stacked body comprises a first insulating layer,
the second stacked body comprises a second insulating layer, and
a dielectric constant of the first insulating layer is higher than a dielectric constant of the second insulating layer.

13. The antenna module according to claim 12, wherein the antenna includes a plurality of antennas, and
at least one of the plurality of antennas is disposed in the flexible region of the printed circuit board, and at least another of the plurality of antennas is disposed in the rigid region of the printed circuit board.

14. The antenna module according to claim 12, wherein the first stacked body comprises a wiring layer, and
the antenna is connected to the wiring layer by an anisotropic conductive film.

15. The antenna module according to claim 12, wherein the first insulating layer comprises at least one of a ceramic and a ceramic-polymer composite.

16. A printed circuit board comprising:
a first stacked body including a flexible region and a rigid region, the first stacked body including a plurality of insulating layers that are stacked together with wiring layers therebetween and that extend across both the flexible and rigid regions; and
a second stacked body stacked on the rigid region of the first stacked body, the second stacked body including a plurality of insulating layers that are stacked together with wiring layers therebetween and that extend across only the rigid region from among the rigid and flexible regions,
wherein each of the insulating layers that extends across the flexible and rigid regions has a composition different from each of the insulating layers that extends across only the rigid region from among the flexible and rigid regions, and
wherein each of the insulating layers that extends across the flexible and rigid regions has at least one of a higher dielectric constant (Dk) or a lower dielectric dissipation factor (Df) than each of the insulating layers that extends across only the rigid region from among the flexible and rigid regions.

17. The printed circuit board of claim 16, wherein only the insulating layers that extend across the flexible and rigid regions, from among the insulating layers that extend across the flexible and rigid regions and the insulating layers that extend across only the rigid region, include a liquid crystal polymer (LCP).

18. The printed circuit board of claim 16, further comprising:
an antenna disposed on a surface of the first stacked body opposite to a surface of the first stacked body having the second stacked body thereon,
wherein the antenna is disposed on flexible and rigid regions of the first stacked body.

* * * * *